United States Patent [19]

Driller et al.

[11] Patent Number: 4,851,765
[45] Date of Patent: Jul. 25, 1989

[54] APPARATUS FOR ELECTRICALLY TESTING PRINTED CIRCUIT BOARDS HAVING CONTACT PADS IN AN EXTREMELY FINE GRID

[75] Inventors: Hubert Driller; Paul Mang, both of Schmitten, Fed. Rep. of Germany

[73] Assignee: Mania Elektronik Automatisation Entwicklung und Gerätebau GmbH, Weilrod, Fed. Rep. of Germany

[21] Appl. No.: 90,968

[22] Filed: Aug. 31, 1987

[30] Foreign Application Priority Data

Sep. 8, 1986 [DE] Fed. Rep. of Germany ....... 3630548

[51] Int. Cl.$^4$ .......................... G01R 1/02; G01R 1/04
[52] U.S. Cl. .......................... 324/158 F; 324/73 PC; 324/158 P; 439/841
[58] Field of Search ............... 439/289, 482, 840, 841, 439/66, 79, 80, 819, 824, 81, 82, 476; 324/158 F, 158 P, 73 PC, 72.5, 49

[56] References Cited

U.S. PATENT DOCUMENTS

| | | | |
|---|---|---|---|
| 2,982,935 | 5/1961 | Barnard | 439/841 |
| 3,258,736 | 6/1966 | Crawford et al. | 439/82 |
| 3,437,984 | 4/1969 | Yorgensen | 439/824 |
| 4,357,062 | 11/1982 | Everett | 324/158 F |
| 4,496,903 | 1/1985 | Paulinski | 324/158 P |
| 4,574,236 | 3/1986 | Hechtman | 324/158 F |
| 4,614,386 | 9/1986 | Driller et al. | |
| 4,620,761 | 11/1986 | Smith et al. | 439/66 |
| 4,620,763 | 11/1986 | Mochida | 439/841 |
| 4,632,485 | 12/1986 | Brown et al. | 439/819 |
| 4,724,377 | 2/1988 | Maelzer et al. | 324/158 F |
| 4,724,383 | 2/1988 | Hart | 324/73 PC |

FOREIGN PATENT DOCUMENTS

| | | | |
|---|---|---|---|
| 2437651 | 2/1976 | Fed. Rep. of Germany | 324/158 F |
| 2920226 | 11/1980 | Fed. Rep. of Germany | 324/158 F |
| 3340180 | 11/1983 | Fed. Rep. of Germany | . |
| 3311480 | 10/1984 | Fed. Rep. of Germany | 439/824 |
| 3340243 | 5/1985 | Fed. Rep. of Germany | 324/73 PC |
| 3110056 | 2/1986 | Fed. Rep. of Germany | . |
| 959460 | 3/1950 | France | . |
| 0169774 | 7/1986 | Japan | 324/158 F |
| 2085673 | 4/1982 | United Kingdom | 324/73 PC |
| 8303141 | 9/1983 | World Int. Prop. O. | 324/158 F |

OTHER PUBLICATIONS

"Contact Probe" by A. W. Till, IBM Technical Disclosure Bulletin, pp. 3224–3225, vol. 16, No. 10, Mar. 1974.

Primary Examiner—Reinhard J. Eisenzopf
Assistant Examiner—W. Burns
Attorney, Agent, or Firm—Wenderoth, Lind & Ponack

[57] ABSTRACT

A circuit board testing apparatus includes a plurality of contact elements located in a contact array plane. The contact elements are connected to an electronic control and test structure and during testing are connected through longitudinally rigid test pins to contact portions of a connection carrier or circuit board to be tested. The contact elements are mounted to yield resiliently and are supported against the contact pressure applied during testing. The contact elements are in the form of electrically conductive compression springs located and guided directly in bores in a spring contact array body formed of an electrically insulating material. The rigid test pins seat directly on the compression springs.

27 Claims, 4 Drawing Sheets

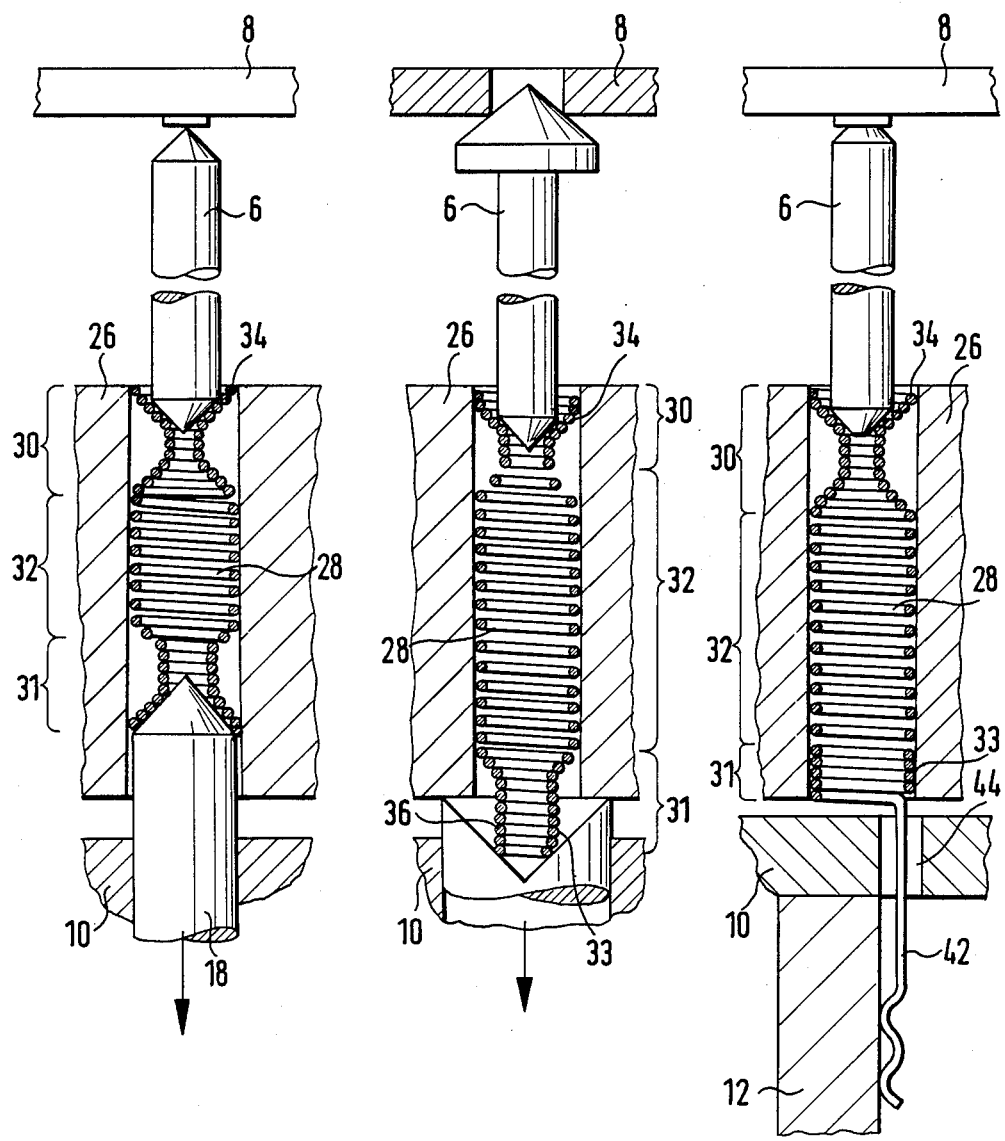

APPARATUS FOR ELECTRICALLY TESTING PRINTED CIRCUIT BOARDS HAVING CONTACT PADS IN AN EXTREMELY FINE GRID

BACKGROUND OF THE INVENTION

The present invention relates to apparatus for electronically testing printed circuit boards and of the type including a plurality of contact elements located in a contact array plane, the contact elements being connected to an electronic control and test means and adapted to be connected through longitudinally rigid test pins to contact positions of a connection carrier or circuit board to be tested, and the contact elements being mounted to yield resiliently and being supported against a contacting pressure applied during a test.

Because of increasing commercial pressure for miniaturization and also because of the concomitant reductions in manufacturing expenses, producers all over the world have begun providing electronic modules on the basis of circuit boards having connection sites or contact pads in an extremely fine grid (1/20 to 1/100 inch grid) and utilizing SMD technology, with component leads that are not inserted through bores (possibly through-contacted) in multi-layer circuit boards but that are connected to contact pads on the component placement side of each board.

Also, manufacturers have realized that bare boards should be tested for functionality prior to component placement to ensure that there are not more or not less, but precisely the number of connections required. As a result, the manufacturers of circuit board testing apparatus must of necessity offer equipment now which enables almost any size and configuration of printed circuit boards having contact pads on an extremely find grid (1/20 to 1/100 inch grid) to be tested without difficulties.

German Patent No. 33 40 180, corresponding to U.S. Pat. No. 4,674,006, discloses a contact array assembly for computer-controlled circuit board testing apparatus using the 1/10 inch grid in which the contact array is subdivided to define contact array sections each removably supported by elongated supporting struts on a base plate. The space so created is used for accommodating the electronic components associated with each contact array section. These components are connected through a plug-type connection with a two-dimensional control circuit provided on a base plate. These sections (referred to as "contact array modules") are identically constructed and exchangeable for each other at any position of the base plate. This design concept results in circuit board testing apparatus comprising a fairly large basic contact array (having e.g. 256 contacts in each of the X and Y directions), yet operable with a very small number of electronic modules, the number of which may be increased as needed without problems.

The desire underlying the present invention is to realize that same basic concept for apparatus operating with an extremely fine grid (1/20 to 1/100 inch grid). In the past, so-called "reduction adaptors" as described in German Pat. No. 33 40 179, corresponding to U.S. Pat. No. 4,614,386, were used to reduce the up to 64,000 contact positions of the initial 1/10 inch grid in the X and Y directions of the contact array to a 1/20 inch grid. However, to obtain such reduction, the maximum permissible circuit board dimensions had to be reduced by 50 percent in either direction. As a result, realization on the 1/20 inch grid of the circuit board testing apparatus of German Pat. No. 33 40 180 appears to be constrained by the limits inherent in miniaturization itself, as will be explained in detail hereinafter. It should be noted that the same limits apply regarding expenditures.

In circuit board testing apparatus having a contact array assembly as proposed in German Pat. No. 33 40 180, contact between the connection points or pads on the circuit board under test and the contact elements of the contact array assembly is made by means of test needles each having a tip telescoping resiliently in the longitudinal direction thereof. In the case of the conventional 1/10 inch grid, these contact needles are relatively simple and inexpensive to fabricate. Problems arise, however, if the contact spacing is reduced to 1/20 inch or less, since in such case the test needles cannot have a diameter greater than 0.8 mm. Test pins so thin will buckle and be damaged beyond repair under even the slightest of transverse forces. Besides, resiliently telescoping test pins of this kind are of necessity very complex mechanically so that their manufacturing costs may cause problems, given the large number of such test pins required. Where the previous 1/10 inch grid comprised a maximum of 64,000 contact positions and required a corresponding number of test pins, the 1/20 inch grid results in up to 256,000 contact positions within the same external dimensions of the contact array. Quite obviously, as very large numbers of test pins may be necessary, the cost therefor may be considerable and decide the potential user against purchasing the equipment. Thus, for using the principle proposed in German Pat. No. 33 40 180 where applied to an extremely fine contact grid of 1/20 inch or less, it would be necessary to provide means and structure as simple in construction and as inexpensive in fabrication as possible.

German Utility Model No. 85 34 841.4 of Feb. 20, 1986, corresponding to U.S. patent application Ser. No. 886,639 filed July 15, 1986, proposes the use of uncontoured test pins which are longitudinally rigid and do not have resiliently telescoping contact tips, particularly in case localized connection site densities on the circuit boards are higher than the average connection site density on the 1/10 inch fundamental grid of the contact array of the circuit board test equipment. Since rigid uncontoured contact pins readily can be made to have a rather small diameter, allowing their use at connection site densities higher (at least locally) than the fundamental grid of the circuit board testing equipment without creating a serious risk of the individual test pins shorting against each other, and since uncontoured rigid test pins of this nature are rather inexpensive to fabricate, the use of rigid test pins in the testing of circuit boards laid out on a 1/20 inch grid appears to be obvious initially. It should be kept in mind, however, that the "Flexadapter" approach proposed in German Utility Model No. 85 34 841.4 uses a so-called "active fundamental contact array" which provides for length compensation of all of the rigid test pins used and thus for reliable contact between each one of the test pins and the object under test, such as a printed circuit board, a ceramic connector support or a flexible circuit carrier. Such length compensation is necessary to compensate for possible bending of the rigid test pins and for variable thicknesses of the printed circuit boards, and in order to ensure sufficient contact pressure. An active contact array of this nature is formed by the resilient portions of the contact pins being transferred to the fundamental contact array of the circuit board testing board testing equipment utilized through the use of short contact pins in the form of sleeve-shaped members having an end in the shape of a contact tip and another end internally tapered, each pin being supported by a spring inside the sleeve and provided to receive one end of the rigid test pin. As a result, the active contact array assembly comprises a plurality of short internally tapered test pins corresponding in number to the connection sites to be accommodated and housed in suitable structure above the contact array proper of the circuit board testing apparatus. As a consequence, these internally tapered test pins, being expensive to make, do not relieve the problem of elevated manufacturing expenses. Also, it is most difficult, if not impossible, to reduce sleeve-like test pins having a compression spring therein to a diameter on the order of 0.8 mm, as long as springs so thin and weak are supposed to create sufficient contact pressure, and material strength considerations prohibit a reduction of sleeve wall thickness to less than 0.2 mm. As a result, the problems created by an active contact array of this nature on a 1/20 inch grid ultimately would be prohibitive.

SUMMARY OF THE INVENTION

For the above reasons, it is the fundamental object of the present invention to improve on the manner of contacting a circuit board to be tested so that the use of an extremely fine grid (1/20 to 1/100 inch grid) will not create strength or cost problems of the nature discussed.

The above and other objects of the present invention are achieved by the provision that the contact elements comprise electrically conductive compression springs located and guided directly in bores in a spring contact array body formed of an electrically insulating material. The rigid test pins are seated directly on the compression springs. By providing compression springs which themselves receive the rigid test pins and are structured accordingly, an operable contact array assembly may be realized at reasonable costs despite the required miniaturization (1/20 inch grid or less). Making the body of the spring contact array of ceramic or plastic material is particularly advantageous in that manufacturing techniques may be used which ensure very tight tolerances. Also, these materials facilitate the manufacture of the contact array body in that it may be combined from small units to be assembled to form the contact array body.

In order to enable the available portion of each compression spring for the total contacting pressure to be used effectively for reliable contacting, it may be of particular advantage to coil one or both ends of each compression spring into a pin-shape or a cone-shape. Also, it may be of advantage to coil one or both ends of each compression spring to form an internal taper for directly receiving a testing or contacting pin. As a result, the pin will be retained safely by the compression spring itself.

In order to obtain excellent compression spring guidance inside the associated bores, the ends of the springs can be contiguous maximum diameter turns. For further improvement of the mechanical properties of the compression springs, the contiguous turns thereof may be interconnected mechanically such as by a coating of metal deposited galvanically on the compression springs, which will be made of spring steel in most instances. As a result, the contiguous turns of the compression spring will be joined together. A coating of a special contact material, provided galvanically if desired, on the end portions of the compression springs may considerably reduce contact resistances.

In case the spring contact array body having therein bores receiving the compression springs is combined from smaller segments adapted to be assembled in array form, it has turned out to be of particular advantage to mount the same on a plug-in supporting member in the form of a so-called "bed of nails", i.e. which has extending therefrom contact pins to extend into respective bores in the contact array body to electrically contact respective compression springs therein. Such supporting member also transmits applied pressures and to this end is suitably supported in the circuit board testing apparatus. In case this plug-in supporting member is relatively large in comparison with body segments from which the spring contact array is assembled, it will contribute to holding the individual segments together in the assembly.

BRIEF DESCRIPTION OF THE DRAWINGS

An embodiment of the present invention will not be described with reference to the accompanying drawings, wherein:

FIGS. 4a–4c are sectional views showing various alternative compression spring designs in a spring contact array body.

DETAILED DESCRIPTION OF THE INVENTION

Figure 1:
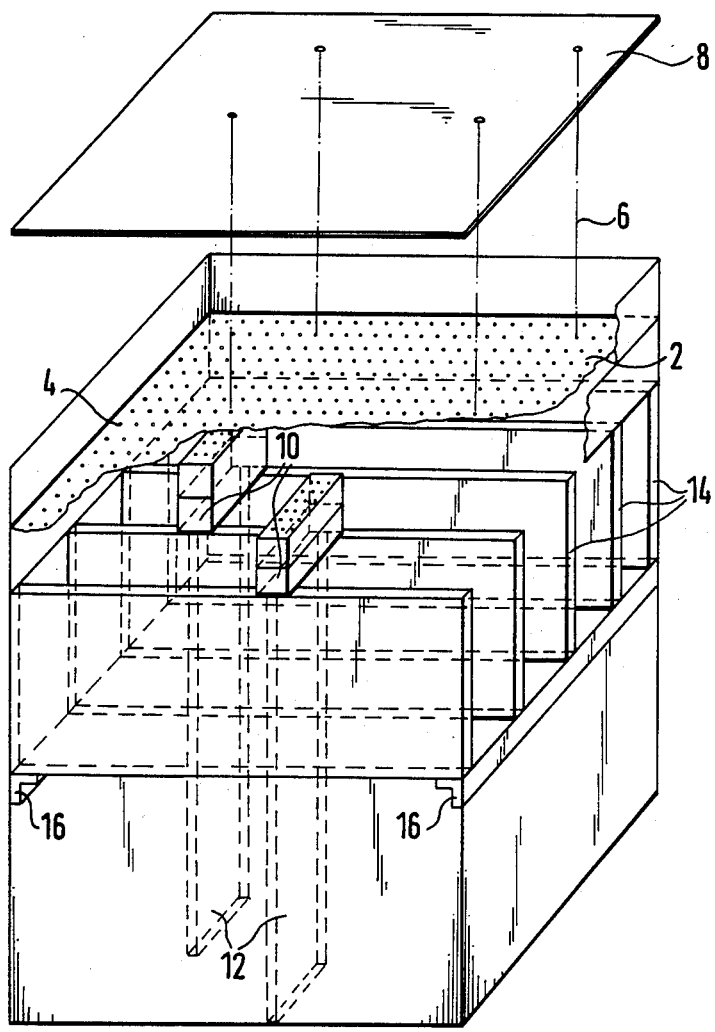
FIG. 1 is a schematic perspective view showing the principles of a circuit board testing apparatus, only a portion of which is shown, constructed in accordance with the present invention FIGS. 2a and 2b respectively are end and side elevation views of a so-called driver card having at a top end thereof a connector and supporting member and supported on bar elements.

FIG. 1 schematically shows an arrangement of and the manner of supporting individual components which make up a contact array 2 having, for example, up to about 256,000 contact positions 4 to be connected through test pins 6 to connector carrier or to a printed circuit board 8 under test. Contacts 4 are arranged in sets of 4×3 or 4×64, each to associated with a contact array plug 10 of the so-called "bed-of-nails" type which is provided at the top end of a so-called driver card 12 supporting electronic components contributing to the electronic testing of the 128 (i.e. 4×32) contacts 4 to be contacted by each contact array plug 10. At the bottom end of driver cards 12 there are provided contact plugs (not shown) to individually connect driver cards 12 (contact array modules), which may be up to about 2,000 in number, with electronic control and test means (not shown) located in the bottom portion of the test apparatus. Such control and test means need not be discussed herein.

Figures 2A, 2B:
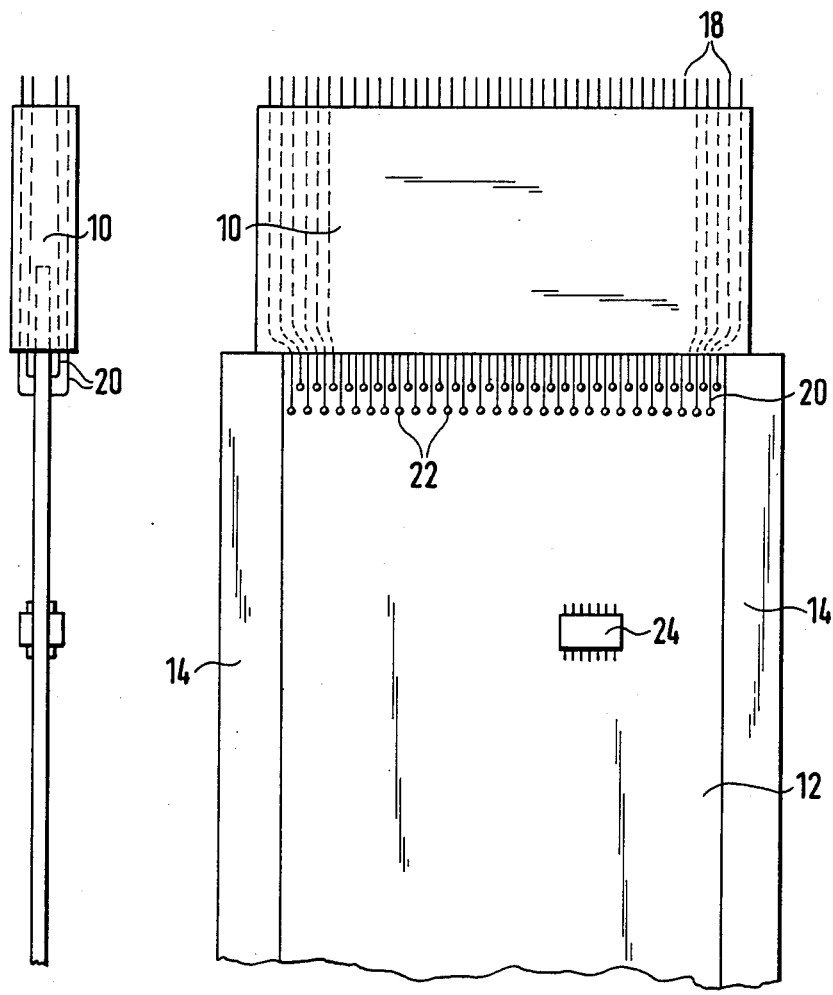

As shown in FIGS. 1 and 2, each of the contact array plugs 10 engages or rests on, by opposite narrow edge end portions thereof, supporting members 14 formed by vertical plate elements to transmit contact pressures, which may have considerable magnitude, to frame 16 of the circuit board testing apparatus. A circuit board 8 to be tested requires contact pressures of about 1–2 Newton per contact 4 to make reliable contact. Given the aforesaid maximum of 256,000 contacts, supporting members 14 together must transmit a total contact pressure of about 32 tons.

Contact array plug 10 consists of an electrically nonconductive plastic or ceramic material and has on its top end surface, for example, a total of 4×32=168 or 4×64=256 upright contact pins 18 each having a diameter on the order of 0.8 mm and a height of 2.5 mm. Pins 18 of plug 10 are extended therein by way of conductors 20 each connected to a contact site 22 on printed circuit driver card 12 to establish electrical connections to electronic components 24 (only one shown in FIGS. 2a–2b) on driver card 12 which are part of the test circuitry in the circuit board testing apparatus.

Figure 3:
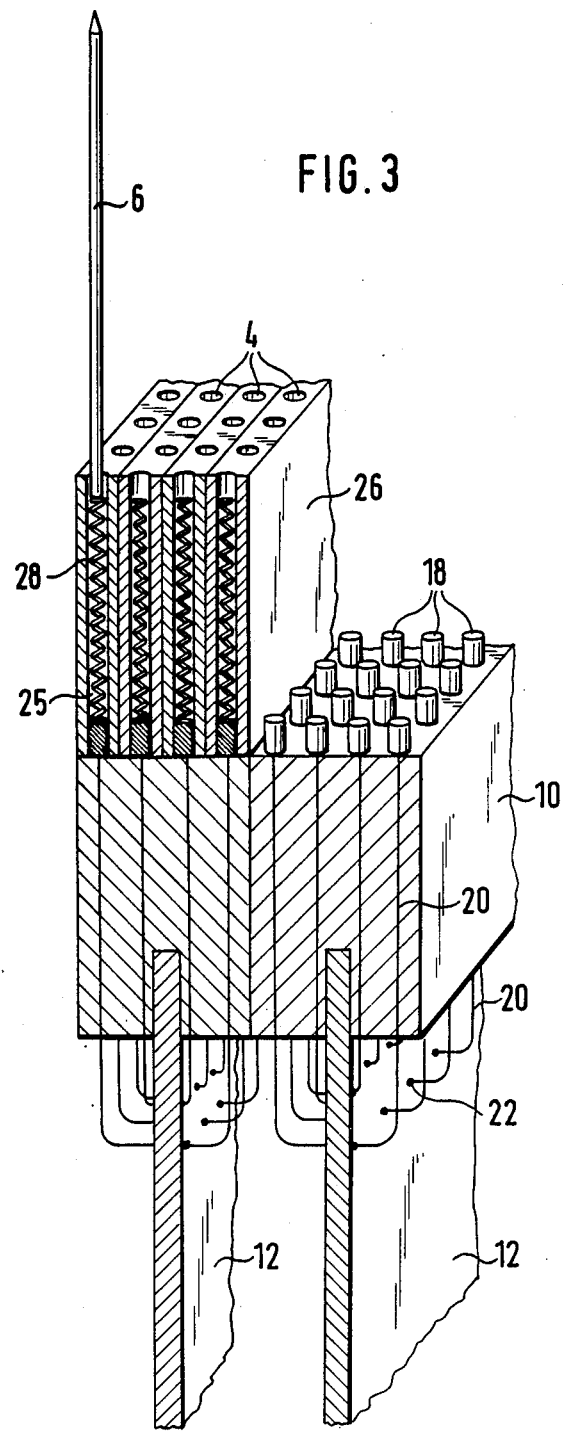
FIG. 3 is a perspective sectional view of the contacting assembly of the invention, disposed between the driver card containing test electronics, and rigid test pins.

Each one of contact pins 18 extends into a respective bore 25 in a spring contact array body 26 containing and substantially filled by a respective contact 4 in the form of a compression spring 28 made of an electrically conductive material. In the preferred embodiment shown in FIG. 3, spring contact array body 26 is in the form of a plurality of strips or segments each having a series of bores therethrough (in accordance with the contact pin arrangement). It is evident, however, that this element does not have to be a strip-shaped element containing only one row of bores 25. It is within the purview of the present invention to have any number of rows of bores in a correspondingly sized spring contact array body 26, as the size of such bodies depends ultimately on the ease of fabricating them. At present, it is preferred to use bodies in strip shape having therein a single row of four bores as it is easier to fabricate them to close tolerances. Such bodies may be arranged on contact array plug 10 as is shown in FIG. 3. It is also possible to arrange them transversely thereto (not shown) so that they extend over the width of each contact array plug 10. Each body is about 50 mm in height and about 1.27 mm in width, with the bores therein having a diameter of about 0.8 mm and being spaced 1.27 mm in accordance with the connection site grid.

Spring contact array bodies 26 are plugged on top of the contact plugs 10. Each bore 25, which is closed at the bottom end by a respective contact pin 18, receives a pressure spring 28 of a special design which fills that bore completely, i.e. the coils in the resilient portion of the pressure spring engage the inner walls of the bores so that maximum diameter springs may be used despite the restricted space conditions.

Ends 30, 31 of springs 28 (shown schematically only in FIG. 3) are formed in a particular manner for directly contacting contact pins 18 of plug 10 or rigid test pins 6. As shown in FIG. 4a, spring 28 is coiled at its two ends (outwardly of its resilient portion 32 having spaced turns) to have longitudinally contiguous turns the diameters of which decrease and then increase in the coiling direction to form an internally tapered portion. There thus is defined at either end of the spring a tapered recess 34 for receiving the tip of a contact pin 18 or a test pin 6, respectively. Preferably, springs 28 may be wound of spring steel and may be plated with a suitable contact material to join the contiguous turns at the ends of the spring.

FIG. 4b shows an alternative form of a contacting arrangement. The spring is configured in its top portion as described above for engagement of test pin 6, i.e. it has an internally tapered portion 34 coiled as described above, whereas its opposite end is coiled to form a pin-shaped extension 36 the individual turns 33 of which are contiguous. The aforesaid pin-like extension extends into a conical recess in a pin in contact array plug 10 which may be tapered or cup-shaped. This recess is to be considered an alternative to the previously described contact pin 18.

FIG. 4c shows another alternative form of the compression spring. The end of spring 28 facing the contact array plug 10 or the driver card 12, respectively, is provided with a contact tongue portion 42 extending longitudinally of the spring to the associated connection site or contact pad on the surface of driver card 12. As a result, the contact array plug 10 has to be provided with properly positioned small-diameter bores 44 through which only the tongues 42 are passed during assembly of the contact array. In this case, too, the end of spring 28 facing test pin 6 is coiled to form an internal taper 34 of longitudinally contiguous spring turns.

It is evident that the particular manner of contacting longitudinally rigid test pins 6 as provided for by the invention, i.e. through (helical) compression springs forming contact elements, can be used advantageously in a circuit board testing apparatus hard-wired for a grid of contacts or connection sites and not including a plurality of identical contact array modules for use at any position of the basic array plate. The present invention is of particular advantage for such latter design concept as it seeks, as does the present invention, to greatly reduce the costs incurred by the contacts required for testing a circuit board or connection carrier.

Further, although the present invention has been described and illustrated with respect to a preferred embodiment, it will be apparent to those skilled in the art that various changes and modifications may be made to the specifically described and illustrated features without departing from the scope of the present invention.

We claim:

1. A contact element assembly for use in a printed circuit board testing apparatus to provide electric connection between electronic control and test means of the testing apparatus and, through longitudinal test pins, contact positions of a connection carrier or circuit board to be tested, said assembly comprising:

a spring contact array body formed of an electrically insulating material and having therethrough a plurality of bores;

a plurality of electrically conductive compression springs, each said spring being located in a respective said bore, each said spring having at a first end thereof means for achieving electrical contact with a longitudinal test pin of the testing apparatus and for centering and guiding the respective longitudinal test pin, at a second end thereof means for achieving electrical connection with the electronic control and test means of the testing apparatus, and between said first and second ends thereof a resiliently yieldable portion;

the relative dimensions of each said bore and the respective said spring being such that, upon application to said spring by the respective longitudinal test pin of a testing contact pressure, said resiliently yieldable portion of said spring engages the surface of said spring contact array body defining said bore; and a driver card supporting electronic control components, a contact array plug on one end of said driver card, said contact array plug including means for making direct electric contact with said means at said second ends of said compression springs and means for transmitting contact pressure to support elements of the circuit board testing apparatus, said electric contact means comprising contact pins extending from said contact array plug to be introduced into said bores in said spring contact array body.

2. An assembly as claimed in claim 1, wherein said spring contact array body is made of a ceramic or a plastic material.

3. An assembly as claimed in claim 1, wherein said spring contact array body is formed of a plurality of segments assembled in array form.

4. An assembly as claimed in claim 1, further comprising a plurality of longitudinally rigid test pins extending into respective said bores and electrically connected to first ends of respective said spring therein.

5. An assembly as claimed in claim 4, wherein said test pins are seated directly on said first ends of said respective springs.

6. An assembly as claimed in claim 1, wherein said means at at least one of said first and second ends of said compression spring is formed by contiguous turns of incrementally and/or gradually reduced coil diameter to form a pin-like shape.

7. An assembly as claimed in claim 1, wherein said means at at least one of said first and second ends of said compression spring is formed by contiguous turns of incrementally and/or gradually reduced coil diameter to form a tapered shape.

8. An assembly as claimed in claim 1, wherein said means at at least one of said first and second ends of said compression spring is formed by contiguous turns of first decreasing and then increasing diameter to define a portion internally tapered for directly receiving an end of a test or contact pin.

9. An assembly as claimed in claim 1, wherein each said compression spring has at least one end portion thereof formed by contiguous turns having maximum diameter for stable guidance inside the respective said bore in said spring contact array body.

10. An assembly as claimed in claim 1, wherein each said compression spring includes contiguous turns interconnected mechanically by means such as a coating of metal plated thereon.

11. An assembly as claimed in claim 1, wherein end portions of said compression springs are coated with a contact material for improved electrical contact.

12. An assembly as claimed in claim 1, wherein said means at said second end of each said compression spring includes a resilient contact tongue extending longitudinally from said compression spring for direct engagement with contact areas of said driver card supporting said electronic control components.

13. An assembly as claimed in claim 12, wherein said resilient contact tongues extend through respective bores in said contact array plug.

14. A contact assembly comprising:
a plurality of contact element assemblies for use in a printed circuit board testing apparatus to provide electric connection between electronic control and test means of the testing apparatus and, through longitudinal test pins, contact positions of a connection carrier or circuit board to be tested, each said assembly comprising:
a spring contact array body formed of an electrically insulating material and having therethrough a plurality of bores;
a plurality of electrically conductive compression springs, each said spring being located in a respective said bore, each spring having at a first end thereof means for achieving electrical contact with a longitudinal test pin of the testing apparatus and for centering and guiding the respective longitudinal test pin, at a second end thereof means for achieving electrical connection with the electronic control and test means of the testing apparatus, and between said first and second ends thereof a resiliently yieldable portion; and
the relative dimensions of each said bore and the respective said spring being such that, upon application to said spring by the respective longitudinal test pin of a testing contact pressure, said resiliently yieldable portion of said spring engages the surface of said spring contact array body defining said bore;
said spring contact array bodies of said plurality of assemblies having different densities of said compression springs therein; and
a plurality of respective electronic control components and driver cards supporting respective contact array plugs having means for making direct electric contact with said means at said second ends of said compression springs of said plurality of spring contact array bodies, said plurality of spring contact array bodies being exchangeably connectable to different of said plurality of contact array plugs.

15. An assembly as claimed in claim 14, wherein said spring contact array bodies are made of a ceramic or a plastic material.

16. An assembly as claimed in claim 14, wherein each said spring contact array body is formed of a plurality of segments assembled in array form.

17. An assembly as claimed in claim 14, further comprising a plurality of longitudinally rigid test pins extending into respective said bores and electrically connected to first ends of respective said springs therein.

18. An assembly as claimed in claim 17, wherein said test pins are seated directly on said first ends of said respective springs.

19. An assembly as claimed in claim 16, wherein said means at at least one of said first and second ends of said compression spring is formed by contiguous turns of incrementally and/or gradually reduced coil diameter to form a pin-like shape.

20. An assembly as claimed in claim 16, wherein said means at at least one of said first and second ends of said compression spring is formed by contiguous turns of incrementally and/or gradually reduced coil diameter to form a tapered shape.

21. An assembly as claimed in claim 14, wherein said means at at least one of said first and second ends of said compression spring is formed by contiguous turns of first decreasing and then increasing diameter to define a portion internally tapered for directly receiving an end of a test or contact pin.

22. An assembly as claimed in claim 14, wherein each said compression spring has at at least one end portion thereof formed by contiguous turns having maximum diameter for stable guidance inside the respective said bore in said spring contact array body.

23. An assembly as claimed in claim 14, wherein each said compression spring includes contiguous turns interconnected mechanically by means such as a coating of metal plated thereon.

24. An assembly as claimed in claim 14, wherein end portions of said compression springs are coated with a contact material for improved electrical contact.

25. An assembly as claimed in claim 14, wherein said electric contact means of each said contact array plug comprise contact pins extending from said contact array plug to be introduced into said bores in said spring contact array bodies.

26. An assembly as claimed in claim 14, wherein said means at said second end of each said compression spring includes a resilient contact tongue extending longitudinally from said compression spring for direct engagement with contact area of one of said driver cards supporting said electronic control components.

27. An assembly as claimed in claim 26, wherein said resilient contact tongues extend through respective bores in said contact array plugs.

* * * * *